United States Patent [19]

Moriyama

[11] Patent Number: 4,498,072
[45] Date of Patent: Feb. 5, 1985

[54] A/D CONVERTER HAVING A SELF-BIAS CIRCUIT

[75] Inventor: Masaru Moriyama, Yamato, Japan

[73] Assignee: Victor Company of Japan, Limited, Japan

[21] Appl. No.: 386,786

[22] Filed: Jun. 7, 1982

[30] Foreign Application Priority Data

Jun. 8, 1981 [JP] Japan .................................. 56-87819

[51] Int. Cl.³ ............................................ H03K 13/02
[52] U.S. Cl. ........................ 340/347 AD; 340/347 CC
[58] Field of Search ................. 340/347 AD, 347 CC; 324/99 D, 130

[56] References Cited

U.S. PATENT DOCUMENTS

| | | | |
|---|---|---|---|
| 3,646,586 | 2/1972 | Kurz | 340/347 AD |
| 4,228,423 | 10/1980 | Schwerdt | 340/347 CC |
| 4,251,803 | 2/1981 | Debord | 340/347 CC |
| 4,282,515 | 8/1981 | Patterson | 340/347 CC |

Primary Examiner—Charles D. Miller
Attorney, Agent, or Firm—Lowe, King, Price & Becker

[57] ABSTRACT

A self-bias circuit is employed for automatically changing the reference voltage of a comparator of an A/D converter of successive approximation type. The self-bias circuit is responsive to a voltage at a summing point where an input analog signal, an offset bias and an output analog signal from a D/A converter are added to each other. The self-bias circuit comprises a resistor and a capacitor so that the capacitor is charged by an average current passing through the resistor connected to the summing point, and the voltage across the capacitor will be used as the reference voltage of the comparator. When the input analog signal amplitude is small, the reference voltage is shifted so that noises superposed on the voltage at the summing point does not cause the comparator to produce an erroneous output signal with which the state of the MSB is undesirably changed. As the amplitude increases, the reference voltage rises for ensuring sufficient dynamic range and symmetrical operation for both positive and negative waves.

7 Claims, 14 Drawing Figures

FIG. 1
PRIOR ART
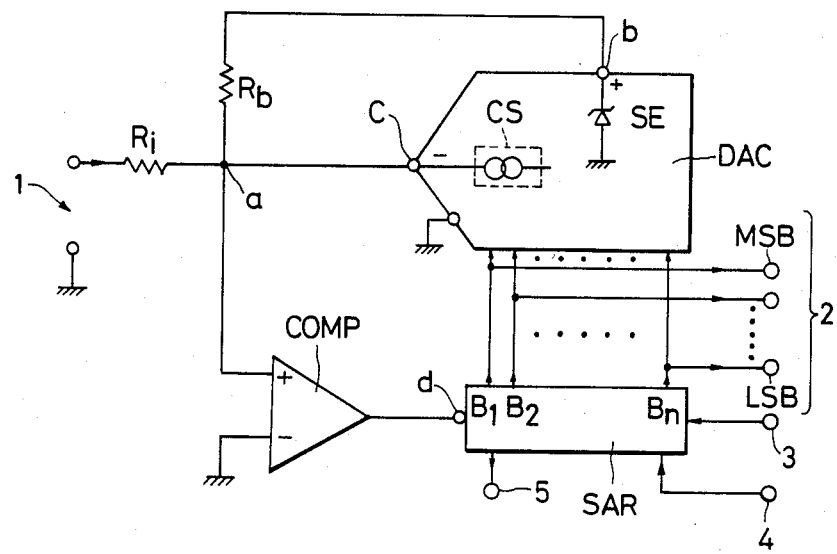
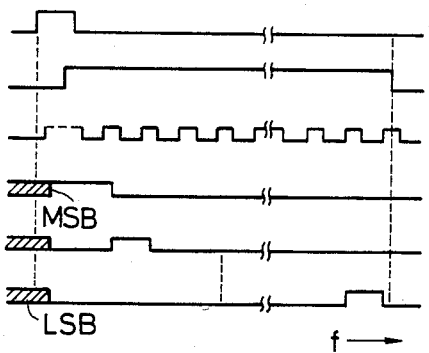
FIG. 2A
FIG. 2B
FIG. 2C
FIG. 2D
FIG. 2E
FIG. 2F

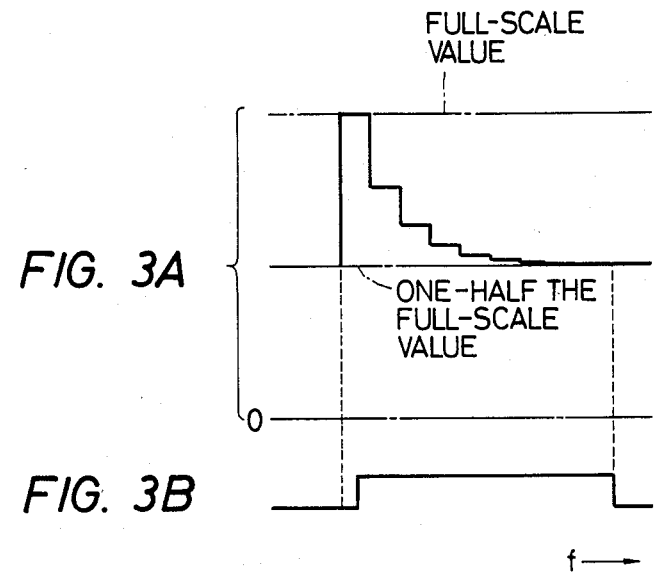
FIG. 3A
FIG. 3B
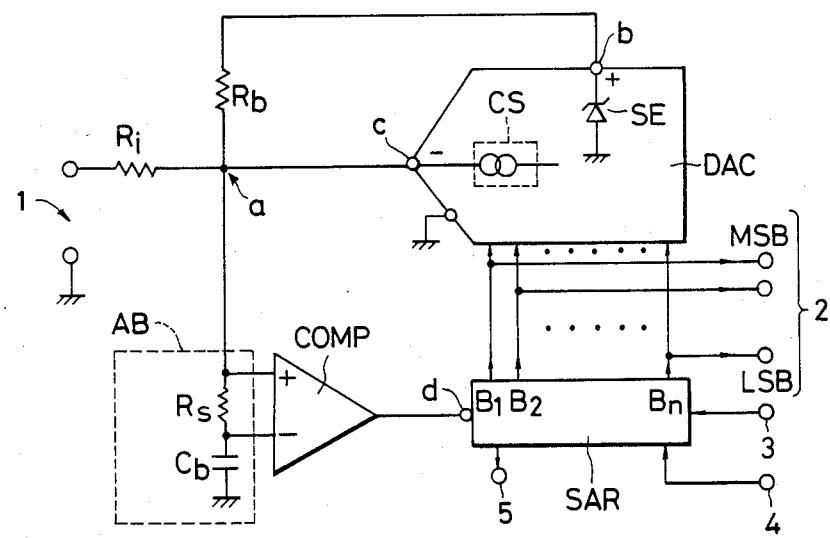
FIG. 4

A/D CONVERTER HAVING A SELF-BIAS CIRCUIT

BACKGROUND OF THE INVENTION

This invention relates generally to analog to digital converters used for converting analog signals, such as audio signals, into digital signals, such as PCM signals. More particularly, the present invention is related to a technique for reducing noises which tend to occur during A/D conversion.

Recently, PCM recorders for recording PCM signals by means of a VTR or the like, and players for reproducing PCM disks in which audio signals have been recorded as PCM signals, have appeared in the market. In order to construct PCM devices for public use, it is needed to provide the same to consumers at low cost. However, there are many problems to be solved in providing PCM devices having a given performance by using low cost circuit parts.

One of the above-mentioned problems is to obtain an analog to digital converter (which will be referred to as an A/D converter hereafter) having given performance at low cost, which is used for converting analog signals into digital signals.

Many types of A/D converters are known, from an integration type to a high-speed parallel type, where an A/D converter of successive comparison or approximation type is usually used for A/D converting an acoustic signal (audio signal) in view of high-speed and accurate characteristics and the cost. Furthermore, since the input signal to be converted is an A.C. signal having positive and negative polarities, an A/D converter of offset binary type, which is D.C. biased at a point of one-half the full-scale range, is generally used.

However, in such a conventional A/D converter, error voltage is apt to occur in connection with most significant bit (MSB) applied to a D/A converter used in the A/D converter due to various reasons. Such an error voltage causes the MSB to assume an erroneous logic state, resulting in an false analog output of the D/A converter. This erroneous analog output is compared with the input analog signal so that undesirable noise signals will be superposed on the input analog signal. Especially, when the amplitude of the input analog signal is small, the superposed noises deteriorate the quality of the audio signal which will be reproduced by decoding the output digital signal from the A/D converter.

Although the above-mentioned problem of introduction of noise can be prevented if expensive parts having high accuracy are used for constructing an A/D converter, such a technique will raise the manufacturing cost, and thus is not suitable for A/D converters for public use.

SUMMARY OF THE INVENTION

The present invention has been developed in order to remove the above-described drawbacks inherent to the conventional A/D converters.

It is, therefore, an object of the present invention to provide an A/D converter having satisfactory characteristics so that noise due to MSB error can be effectively prevented.

According to a feature of the present invention a self-bias circuit is provided so that the reference voltage of a comparator responsive to a voltage at a summing point, where the input analog signal, an output analog signal from a D/A converter and an offset bias voltage are added to each other, is changed such that noise superposed on the input analog signal does not cause the comparator to produce an erroneous output signal when the amplitude of the input signal is below a predetermined level. The reference voltage varies as the amplitude of the input signal increases so that a sufficient dynamic range can be ensured.

In accordance with the present invention there is provided an A/D converter comprising: a comparator for comparing an input analog signal with a reference signal to produce an output signal when the analog signal is greater than the reference signal, the comparator having two input terminals respectively receiving the input analog signal and the reference signal; a successive approximation register responsive to clock pulses and to the output signal from the comparator for producing a digital signal having a predetermined number of bits; a D/A converter responsive to the digital signal to produce an output analog signal; an offset bias circuit for producing a predetermined offset bias voltage; a summing circuit for supplying the comparator with the summation of the input analog signal, the output analog signal from the D/A converter and the offset bias voltage; and a self-bias circuit connected to the two input terminals of the comparator for changing the reference signal in accordance with the summation.

BRIEF DESCRIPTION OF THE DRAWINGS

The object and features of the present invention will become more readily apparent from the following detailed description of the preferred embodiment taken in conjunction with the accompanying drawings in which:

FIG. 1 is a circuit diagram showing an example of the structure of a conventional A/D converter;

FIGS. 2A to 2F and FIGS. 3A and 3B are waveform charts useful for understanding the operation of the conventional A/D converter of FIG. 1;

FIG. 4 is a schematic circuit diagram showing the principle of the A/D converter according to the present invention;

The same or corresponding elements and parts are designated at like references throughout the drawings.

DETAILED DESCRIPTION OF THE INVENTION

Figure 5:
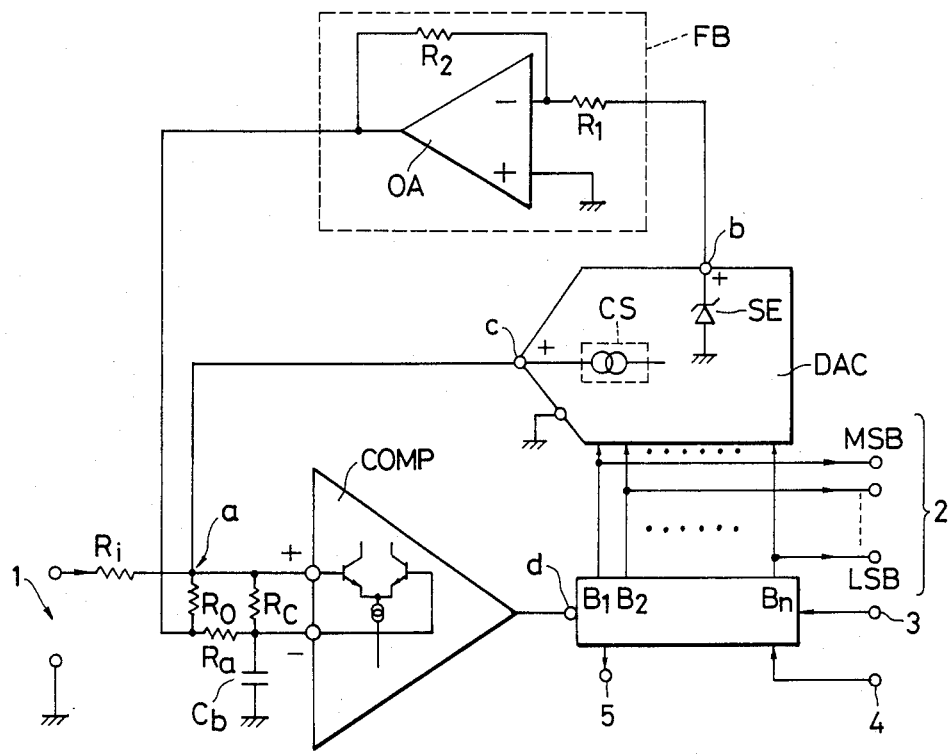
FIG. 5 is a schematic circuit diagram of an embodiment of the A/D converter according to the present invention.

Prior to describing the preferred embodiment of the present invention, the above-mentioned conventional A/D converter will be first described for a better understanding of the present invention.

FIG. 1 is a block diagram showing one example of the conventional A/D converter of the offset binary type. In FIG. 1, the reference numeral 1 is an input terminal for an analog signal having positive and negative polarities and the converter is seen to include a number of elements identified as follows: COMP, a voltage (or current) comparison circuit, (which will be simply referred to as a comparator COMP hereafter); SAR, a successive approximation register; DAC, a digital to analog converter, (which will be simply referred to as a D/A converter or DAC hereafter); and 2, an output terminal for a digital signal. In FIG. 1, the reference 3 is an input terminal of a START signal; 4, an input terminal of a clock signal; 5, an output terminal for a STATUS signal; SE, an offset bias source (in the illustrated example, this is built in the D/A converter DAC); and CS, an output current source of the D/A converter DAC.

In the conventional offset binary type A/D converter of FIG. 1, the input analog signal applied to the input terminal 1 is fed, via a resistor $R_i$, to a summing point "a" connected to an output terminal "c" of the D/A converter DAC, and also connected, via a bias resistor $R_b$, to an output terminal "b" of the offset bias source SE, and the summing point "a" is connected to a comparison signal input terminal of the comparator COMP.

The above-mentioned comparator COMP is arranged such that its reference signal input terminal is grounded, and its output terminal is connected to a serial input terminal of the successive approximation register SAR. The comparator COMP provides a logic 1 or logic 0 to the serial input terminal "d" of the successive approximation register SAR depending on the fact whether the potential at the summing point "a" is or is not above a threshold preset in the comparator COMP. Namely, when the potential at the summing point is greater than the ground potential, a logic "1" signal is fed to the input terminal "d" of the successive approximation register SAR.

The successive approximation register SAR performs a given operation in response to the START signal (see FIG. 2A) applied to the input terminal 3 and the clock signal (FIG. 2C) applied to the input terminal 4, so as to produce a digital signal. Namely, the MSB is set to the logic "1" state and the output analog voltage from the output terminal "c" of the D/A converter DAC, which is one-half the full scale analog input range, is compared with the input analog signal. If it is smaller than the input analog signal, the MSB is left on and the next bit is tried. If the analog output from the D/A converter is larger than the input analog signal, on the other hand, the MSB is turned off when the next significant bit is turned on. This process of comparison continued on each bit down to and including the LSB.

Therefore, the current flowing through the output terminal "c" of the D/A converter DAC varies so that the potential at the summing point "a" approaches zero. Namely, the potential at the summing point "a" will be equal to the ground potential as time passess. The digital signal including a predetermined number of bits from the successive approximation register SAR is also fed to a set of output terminals 2.

FIG. 2B shows the STATUS signal developed at the terminal 5, which STATUS signal will be used to indicate that the A/D converter is performing A/D conversion. FIGS. 2D to 2F are explanatory diagrams showing examples that the logic value of each place of the digital signal fed to the input terminal of the D/A converter DAC is determined from its MSB to its LSB in accordance with the potential at the summing point "a" in a given sampling period. The hatched portion in the left side in each of FIGS. 2D to 2F are stored information regions in registers of the successive approximation register at the time before it is cleared in receipt of the START signal. FIG. 3A shows an example of the output condition at the output terminal "c" of the D/A converter DAC on an assumption that all the bits from the MSB to the LSB of the digital signal fed to the D/A converter DAC are of logic 1 at a given sampling period.

In the above-mentioned conventional offset binary type A/D converter of FIG. 1, when the input analog signal fed to the input terminal 1 is of 0-amplitude, an offset bias voltage is fed through the bias resistor $R_b$ from the offset bias source SE so that the potential at the summing point "a" is one-half the full-scale input analog signal range if the summing point "a" does not receive the output analog signal from the D/A converter. At this time, however, the D/A converter supplies the summing point "a" with a voltage corresponding to one-half the full-scale input analog signal range because the MSB is of logic "1" and remaining bits are of logic "0". The successive approximation register SAR is arranged to output a digital signal of natural binary code. In the above-condition, the potential at the summing point "a" is equal to the ground potential due to the above-mentioned offset bias voltage.

In the case that the input signal fed from the input terminal 1 through the resistor $R_i$ to the summing point "a" is an A.C. signal having both positive and negative polarities, if the peak to peak value thereof equals the full-scale range of the A/D converter, for instance, the digital signal fed from the successive approximation register SAR to the D/A converter DAC and the digital signal fed to the output terminal of the A/D converter have a condition that all the bits from its MSB to LSB are of logic 1 when the input signal assumes its positive peak value, and on the other hand, all the bits from its MSB to LSB of the above-mentioned digital signal are of logic 0 when the input signal assumes its negative peak.

It is a matter of course that the digital signal output from the A/D converter assumes a state which is between the above-mentioned two states of the bits thereof in accordance with the voltage variation between the positive and negative peaks.

The above-described offset binary type A/D converter as well as an A/D converter of 2s complement type has been hitherto used as an A/D converter in measuring devices. However, in measuring devices, since it is needed accurately to measure an objective to be measured, an A/D converter used therein has to be so accurate that the accuracy of a ladder network, for instance, and other portions should be less than one-half the LSB of a digital signal where the number of bits of the digital signal is determined in view of quantization distortion. Accordingly, because of use of expensive parts the cost of such A/D converters used in measuring devices is high, and therefore, such an A/D converter cannot be adopted for public use in view of the price.

Therefore, it has been strongly desired to develop an A/D converter which is so inexpensive that it can be adapted to digital devices for public use, such as public use audio PCM devices, and which has desired performance.

In an A/D converter for effecting A/D conversion with an audio signal applied, occurrence of noise and distortion should be avoided when processing the audio signal. In an A/D converter of successive approximation type is which A/D conversion is effected in the operations described with reference to FIG. 1, since A/D conversion of each signal portion at each sampling period is performed in such a way that the logic value of the MSB of the digital signal is determined first, and then logic values of less significant bits are determined one after another, if an error occurs in the determination of the logic value of the MSB by some reason, the reproduced signal will suffer considerably.

On the other hand, audio signals include much music information even if the signal is of low level, and therefore, it is necessary to process such a low-level signal with a given resolution. Moreover, since a masking effect cannot be expected in connection with such low-level signals, occurrence and introduction of noises should be avoided when processing such low-level signals.

However, in an A/D converter, it is inevitable that an MSB error voltage occcurs in a D/A converter constituting the A/D converter; logic circuit noise occurs in peripheral logic circuits; and D.C. drift occurs in the D/A converter, the comparator and in other circuits. Therefore, when the level of an audio signal to be A/D converted is low, A/D conversion is not correctly performed because of noise introduced into the audio signal which is the subject of A/D conversion, thereby deteriorating the resolution of A/D conversion for low-level signals. Thus noise and distortion are apt to occur in the reproduced signals.

As a technique for preventing the resolution from being deteriorated due to the influence of MSB error voltage, there is a known method of using a sign magnitude type D/A converter arranged such that D/A nonlinear glitch has symmetry for its positive and negative inputs. However, even if this technique is adopted, there are many problems in connection with the circuit configuration, such that a problem is left that continuity cannot be ensured on positive-negative inversion because of D.C. drift, and the various above-mentioned problems are not resolved by an A/D converter using a sign magnitude type D/A converter.

Although it is possible to solve the above-mentioned problems by constructing an A/D converter using high accuracy components, such an A/D converter cannot be adapted to digital devices for public use as described above.

The present invention has made it possible, as a result of research, to provide an A/D converter having necessary performance in audio signal processing at low cost by constructing an A/D converter so that three conditions are satisfied when an objective signal to be processed is an audio signal, where the three conditions are: (1) Even if absolute accuracy does not result, all required is to ensure a monotonically increasing function; (2) D.C. drift offset is not required to be A/D converted because variations in D.C. component in the reproduced signal corresponding to the A/D converted D.C. drift offset cannot be sensed by human ears; and, (3) It is needed to have sufficient resolution against low-level signal.

Hereinbelow will be described detailed contents of the D/A converter according to the present invention with reference to accompanying drawings. FIG. 4 is a circuit diagram showing the structural principle of the A/D converter according to the present invention, and FIG. 5 is a circuit diagram of an embodiment of the A/D converter according to the present invention.

In FIGS. 4 and 5, circuits and elements corresponding to those in the A/D converter shown in FIG. 1 are designated at like references. First of all, the constructional principle and operating principle of the A/D converter according to the present invention will be described with reference to FIG. 4.

The A/D converter according to the present invention differs from the conventional one shown in FIG. 1 in that an additional bias circuit AB is provided. The additional bias circuit AB, which functions as a self-bias circuit as will be described later, comprises a resistor $R_s$ connected between first and second input terminals (+, −) of the comparator COMP, and a capacitor $C_b$ (bias-generating capacitor $C_b$) connected between the second input terminal (−) of the comparator COMP and ground. The first input terminal (+) of the comparator COMP is connected to the summing point "a". In this way, since the additional bias circuit AB is provided to the A/D converter of FIG. 4, the bias-generating capacitor $C_b$ will be charged by an average current of a difference voltage between the voltage of the input analog signal fed through the resistor $R_i$ to the summing point "a" and the output voltage from the D/A converter DAC.

Therefore, the comparison by the comparator COMP is effected by comparing the voltage at the summing point "a" and the terminal voltage at the nongrounded side of the bias-generating capacitor $C_b$.

Since the voltage across the capacitor $C_b$ varies in accordance with the average voltage at the summing point "a", the series circuit of the resistor $R_s$ and the capacitor $C_b$ functions as a self-bias circuit which changes the reference voltage of the comparator COMP. Therefore, the reference voltage is shifted in accordance with the level of the input analog signal so that noise superposed on the analog signal at the summing point "a" does not cause the comparator to produce an erroneous output as long as the amplitude of the noise exceeds a predetermined value. Consequently, the MSB from the successive approximation register SAR is fixed to a logic "0" irrespective of superposed noises when the amplitude of the input analog signal is small.

Therefore, even if the voltage at the summing point "a" varies due to noise introduced into the input signal or noise generated in various parts of the A/D converter, the logic value of the MSB of the input digital signal applied to the D/A converter DAC does not change, and thus A/D conversion of an analog input signal of very low level can be performed with sufficient resolution, while noise generation is prevented during A/D conversion.

In the case that the amplitude of the input analog signal exceeds the above-mentioned predetermined range, the above-mentioned fixed condition of the logic value of the MSB of the digital signal is cancelled. Meanwhile the bias voltage of the above-mentioned self-bias circuit varies so that the difference with the original offset bias voltage of the A/D converter equals the voltage difference between the analog signal voltage from the output terminal "c" of the D/A converter DAC and the input analog signal voltage, and equals a predetermined voltage. Therefore, even if the amplitude of the input analog signal increases to correspond to the full-scale range, the A/D converter is capable of performing symmetrical A/D conversion for both the positive and negative waves of the input analog signal.

In the A/D converter shown in FIG. 4, the resistor $R_s$ and the capacitor $C_b$ constituting the additional bias circuit AB are selected so that the time constant, which is defined thereby, is sufficiently greater than the period corresponding to the lowest frequency of the input analog signal.

The potential at the summing point "a" in the absence of the output analog signal from the D/A converter DAC may be set to one-half the full-scale range when the analog input signal is zero, or may be set to a value which deviates slightly, in either positive or negative direction, from one-half the full-scale range when the analog input signal is zero.

An embodiment of the A/D converter according to the present invention, shown in FIG. 5 will be described. The A/D converter of FIG. 5 is constructed so that introduction of noise can be satisfactorily prevented, although noise introduction from digital circuits to analog circuits tends to occur when linear circuits, such as the comparator COMP and the offset bias source SE, and digital circuits, such as the successive approximation register SAR and unshown logic input circuits and output registers of the D/A converter DAC, are mixed in the A/D converter.

Namely, circuit configuration for operating with positive and negative power sources is generally adopted for linear circuits, and thus positive and negative power sources are employed as its power sources, whereas digital circuits are constructed so that they operate with only a positive (or negative) power source. When linear circuits and digital circuits are both mixed in the same circuit, it is needed to attach great importance to the separation of ground of each of the power sources in view of prevention of the noise introduction to and from the linear circuits and the digital circuits.

In the A/D converter of FIG. 5, since the power source of the digital circuits uses only a positive power source, the potential at the summing point "a" is made slightly negative from one-half the full-scale range when the input analog signal is zero so that comparison operation in the comparator COMP is prevented from being malfunctioning due to positive noises generated in the digital circuits. This is achieved by the circuit interposed between the offset bias source SE and the summing point "a".

The positive voltage of the offset bias source SE is converted into a predetermined negative voltage by an operational amplifying circuit FB having resistors $R_1$ and $R_2$ and an operational amplifier OA, and is fed via the resistor $R_a$ to the second or reference signal input terminal (−) of the comparator COMP.

As a result, the potential at the summing point "a" is set to a voltage which deviates slightly toward the negative side from the voltage which is one-half the full-scale value in the absence of the output analog signal from the D/A converter DAC. This voltage can be set to a desired value by changing the values of the resistors $R_1$ and $R_2$ as is well known.

With the provision of the above-mentioned circuit arrangement, even if the potential at the summing point "a" is shifted due to superposed noise, the relative voltage difference between the first or comparison signal input terminal (+) and the second or reference signal input terminal (−) of the comparator COMP does not change because the voltage at the second input terminal (−) has been shifted as much as the amount of shifting of the voltage at the summing point "a", and therefore, essential comparison operation in the comparator COMP is not affected by the provision of the above-mentioned circuit arrangement.

The capacitor $C_b$ shown in FIG. 5 is equivalent to the capacitor $C_b$ in the A/D converter of FIG. 4, while a resistor network ($R_o$, $R_a$ and $R_c$), substantially functioning as the combination of the resistor $R_b$ and another resistor $R_s$ of FIG. 4, is employed. Namely, the combination of the resistor network and the capacitor $C_b$ functions as a self-bias circuit in the embodiment of FIG. 5. Although the resistors $R_o$, $R_a$ and $R_c$ are connected in the form of Delta-connection, these resistors $R_o$, $R_a$ and $R_c$ may be connected in the form of Star-connection or other fashion. With this arrangement, the difference between the analog output signal from the D/A converter DAC and the input analog signal, which is shifted by the offset bias, is compared with the self-biased reference voltage.

Figure 6:
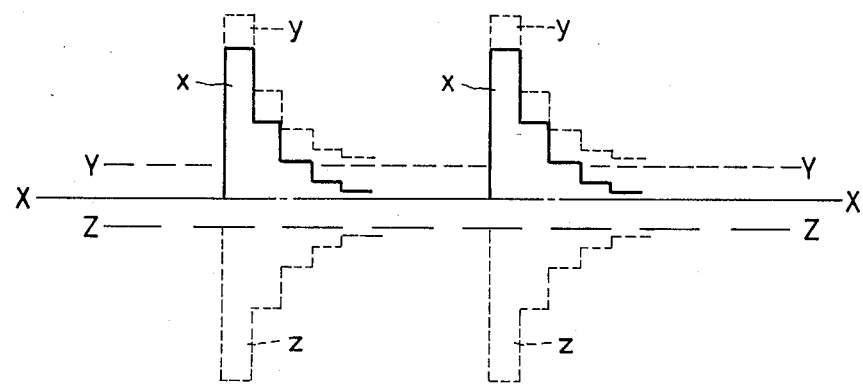
FIG. 6 is a waveform chart useful for understanding the operation of the A/D converter of FIG. 5.

FIG. 6 is a waveform chart for the description of the operation of the A/D converter of FIG. 5. A line X—X in FIG. 6 is the potential at the summing point "a" when the input analog signal is at zero volts in the absence of the output analog signal from the D/A converter DAC. This voltage at the summing point "a" has been shifted by the operational amplifying circuit FB by a predetermined voltage toward the negative side from one-half the full-scale range as described above.

When an analog signal is applied to the input terminal 1 of FIG. 5, in the case that the input analog signal is of small amplitude, a voltage equal to the sum of the output voltage from the D/A converter DAC, the offset bias voltage applied via the resistor $R_o$ and the voltage of the analog signal applied via the resistor $R_i$ is developed at the summing point "a". This voltage is fed via the resistor network comprised of the three resistors $R_o$, $R_a$ and $R_c$ to the bias capacitor $C_b$ so that the bias capacitor $C_b$ is charged by an average current of the comparison waveform x shown in FIG. 6, causing the voltage at the nongrounded terminal of the bias capacitor $C_b$ to assume the voltage of Z—Z of FIG. 5. The comparison waveform x represents the variation in voltage at the summing point "a" where the waveform is illustrated to be converged to the above-mentioned small negative voltage because of successive approximation.

As the amplitude of the input analog signal increases, since the bias capacitor $C_b$ is charged by a comparison waveform y, whose level is higher than that of the waveform x because of the greater analog input, at the summing point "a", the reference voltage of the comparator COMP is shifted toward the line Y—Y. Namely, the line Y—Y shows the reference voltage, i.e. the terminal voltage of the bias capacitor $C_b$, obtained when the amplitude of the input analog signal equals the full-scale range. Another waveform z shows the voltage at the summing point "a" which converges to a predetermined voltage in the same manner as the waveform x but in a different direction, namely from a large negative voltage to a small negative voltage.

From the above, it will be understood that self-biasing is effected so as to change or shift the reference voltage of the comparator COMP in accordance with the potential at the summing point "a".

When the polarity of the voltage at the summing point "a" changes from positive to negative (or from negative to positive) due to the polarity change from the analog output signal from the D/A converter, the bias voltage across the capacitor $C_b$ also changes. However, the variation in the bias voltage, i.e the reference voltage applied to the second input terminal (−) of the comparator COMP, occurs gradually in the same manner as a D.C. drift. Therefore, the variation in bias voltage of the self-bias circuit does not result in any problemes because it cannot be sensed by human ears when being reproduced.

In the A/D converter according to the present invention, with the provision of the self-bias circuit, when the amplitude of the input analog signal is within a predetermined small range, the analog signal having a small amplitude never exceeds the threshold set in the comparator because of the self-bias, which is automatically set by the self-bias circuit, and therefore, the logic value of the MSB of the digital signal is continuously fixed to a predetermined value so that generation of noise, which tends to become a problem when receiving a low-level input analog signal, is satisfactorily prevented. On the other hand, when the amplitude of the input analog signal is greater than the predetermined range, the fixed condition of the logic value of the MSB of the digital signal is cancelled, while the bias voltage by the self-bias circuit varies so that original offset bias voltage of the A/D converter has a predetermined voltage difference upon receiving 0-amplitude input analog signal. Therefore, in the case that a large-amplitude analog signal is input corresponding to the full-scale range, A/D conversion is effected symmtrically for the positive waves and negative waves of the input analog signal ensuring sufficient dynamic range, and thus no distortion occurs.

Figure 7:
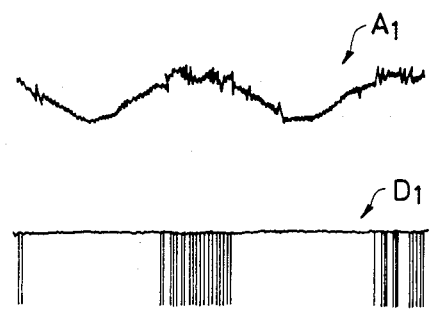
FIGS. 7 and 8 are waveform charts useful for understanding the difference between occurrence of noise in the conventional A/D converter of FIG. 1 and in the new A/D converter of FIG. 5.
Figure 8:
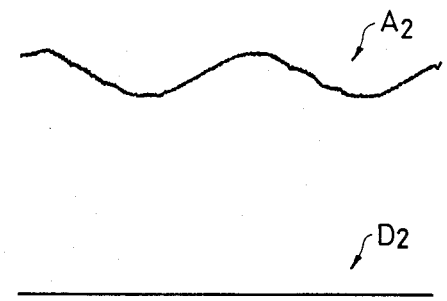

FIG. 7 shows the waveform of an analog signal $A_1$ obtained by D/A converting the output signal from a conventional offset binary type A/D converter by means of a D/A converter having satisfactory characteristics and the waveform of the MSB of the digital signal $D_1$ applied to the D/A converter DAC which outputs the analog signal $A_1$. FIG. 8 shows the waveform of the analog signal $A_2$ obtained by D/A converting the output signal from the A/D converter to which the present invention is applied by means of a D/A converter having satisfactory characteristics and the waveform of the MSB of the digital signal $D_2$ applied to the D/A converter DAC which outputs the analog signal $A_2$.

As will be readily understood by comparing FIG. 7 and FIG. 8, a contrast exists between the conventional A/D converter and the present embodiment the conventional offset binary type A/D converter, noises are introduced into the objective analog signal because of the change in the logic value of the MSB during A/D conversion of low-level input voltage signal, so that noises increase partially more than original quantization noise. However, in the A/D converter according to the present invention, since the logic value of the MSB is fixed to either logic "1" or "0" by the bias generated by the self-bias circuit when receiving a low-level signals, noises are effectively prevented from being superposed on the input analog signal. Therefore, A/D conversion can be effected with satisfactory resolution.

As described in the above, according to the technique of the present invention it is possible to readily provide an A/D converter having superior performance with low-cost parts and circuits because of the provision of the self-bias circuit.

The above-described embodiment are just examples of the present invention, and therefore, it will be apparent for those skilled in the art that many modifications and variations may be made without departing from the spirit of the present invention.

What is claimed is:
1. An A/D converter comprising:
(a) a comparator for comparing an input analog signal with a reference signal to produce an output signal when said analog signal is greater than said reference signal, said comparator having two input terminals respectively receiving said input analog signal and said reference signal;
(b) a successive approximation register responsive to clock pulses and to said output signal from said comparator for producing a digital signal having a predetermined number of bits;
(c) a D/A converter responsive to said digital signal to produce an output analog signal;
(d) an offset bias circuit for producing a predetermined offset bias voltage;
(e) a summing circuit for supplying said comparator with the summation of said input analog signal, said output analog signal from said D/A converter and said offset bias voltage; and
(f) a self-bias circuit connected to said two input terminals of said comparator for changing said reference signal in accordance with said summation, said self-bias circuit comprising a resistor interposed between said two input terminals of said comparator, and a capacitor interposed between one of said two input terminals and ground.

2. An A/D converter as claimed in claim 1, wherein said offset bias circuit comprises a voltage source and an inverting circuit for inverting the polarity of the voltage from said voltage source.

3. An A/D converter as claimed in claim 2, wherein said inverting circuit comprises an operational amplifier associated with an input resistor and a feedback resistor.

4. An A/D converter as claimed in claim 3, wherein said input resistor and said feedback resistor are so selected that the reference voltage applied to said comparator assumes either positive or negative polarity irrespective of the amplitude of said input analog signal.

5. An A/D converter comprising:
(a) a comparator for comparing an input analog signal with a reference signal to produce an output signal when said analog signal is greater than said reference signal, said comparator having first and second input terminals respectively receiving said input analog signal and said reference signal;
(b) a successive approximation register responsive to clock pulses and to said output signal from said comparator for producing a digital signal having a predetermined number of bits;
(c) a D/A converter responsive to said digital signal to produce an output analog signal;
(d) an offset bias circuit for producing a predetermined offset bias voltage;
(e) a summing circuit for supplying said first input terminal of said comparator with the summation of said input analog signal, said output analog signal from said D/A converter and said offset bias voltage, said summing circuit having a first resistor for passing said input analog signal therethrough and a second resistor connected to said offset bias circuit; and
(f) a self-bias circuit connected to said two input terminals of said comparator for changing said reference signal in accordance with said summation, said self-bias circuit having a third resistor interposed between said first and second input terminals of said comparator, and a capacitor interposed between said second input terminal and ground, said second input terminal of said comparator being connected via a fourth resistor to said offset bias circuit.

6. An A/D converter as claimed in any one of the preceding claims, wherein said self-bias circuit has a time constant which is set to a value much greater than the period of the lowest frequency of said input analog signal.

7. An A/D converter as claimed in claims 1, 2, 3, 4 or 5, wherein said self-bias circuit has a time constant which is set to a value corresponding to a period of a frequency which is lower than audio frequency.

* * * * *